United States Patent
Lin

(10) Patent No.: US 6,483,147 B1
(45) Date of Patent: Nov. 19, 2002

(54) THROUGH WAFER BACKSIDE CONTACT TO IMPROVE SOI HEAT DISSIPATION

(75) Inventor: Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/427,135

(22) Filed: Oct. 25, 1999

(51) Int. Cl.[7] .................. H01L 27/01; H01L 27/12; H01L 31/392; H01L 23/10; H01L 23/34
(52) U.S. Cl. .................. 257/347; 257/348; 257/350; 257/706
(58) Field of Search .................. 257/347, 698, 257/717, 706, 774, 348–351, 720; 438/311, 149, 406, 620, 667, 675

(56) References Cited

U.S. PATENT DOCUMENTS

| | | | | |
|---|---|---|---|---|
| 5,234,535 A | | 8/1993 | Beyer et al. ................ 156/630 |
| 5,278,077 A | * | 1/1994 | Nakato ........................ 438/517 |
| 5,308,594 A | | 5/1994 | Chen ........................... 117/222 |
| 5,463,241 A | | 10/1995 | Kubo .......................... 257/376 |
| 5,488,004 A | | 1/1996 | Yang ............................ 437/35 |
| 5,511,428 A | * | 4/1996 | Goldberg et al. ............. 73/777 |
| 5,567,629 A | | 10/1996 | Kubo ........................... 437/24 |
| 5,770,881 A | | 6/1998 | Pelella et al. ................ 257/347 |
| 5,780,900 A | | 7/1998 | Suzuki et al. ................ 257/335 |
| 5,869,867 A | * | 2/1999 | Takeuchi ..................... 257/347 |
| 5,889,306 A | * | 3/1999 | Christensen et al. ......... 257/350 |
| 5,945,712 A | * | 8/1999 | Kim ............................ 257/347 |
| 6,002,154 A | * | 12/1999 | Fujita .......................... 257/349 |
| 6,121,659 A | * | 9/2000 | Christensen et al. ........ 257/347 |
| 6,190,985 B1 | * | 2/2001 | Buynoski ..................... 438/311 |

\* cited by examiner

Primary Examiner—Steven Loke
Assistant Examiner—Shouxiang Hu
(74) Attorney, Agent, or Firm—Amin & Turocy, LLP

(57) ABSTRACT

In one embodiment, the present invention relates to a method of facilitating heat removal from a device layer of a silicon-on-insulator substrate comprising bulk silicon, an insulation layer over the bulk silicon, and a silicon device layer over the insulation layer involving forming at least one conductive plug comprising a conductive material within the bulk silicon and the insulation layer so as to contact the silicon device layer. In another embodiment, the present invention relates to a silicon-on-insulator structure, made of a silicon substrate layer; an insulation layer over the silicon substrate layer; a silicon device layer comprising silicon over the insulation layer; a conductive plug through the silicon substrate layer and the insulation layer contacting the silicon device layer; and a heat generating structure on the silicon device layer at least partially overlapping the conductive plug.

1 Claim, 3 Drawing Sheets

THROUGH WAFER BACKSIDE CONTACT TO IMPROVE SOI HEAT DISSIPATION

TECHNICAL FIELD

The present invention generally relates to improved Silicon-on-Insulator devices. More particularly, the present invention relates to methods for removing heat from the device layer of Silicon-on-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal conductivity of silicon dioxide is about 1.4 W/m° C. while the thermal conductivity of conventional bulk silicon is about 150 W/m° C. As a result, the buried oxide layer undesirably insulates thermally the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of facilitating heat removal from a device layer of a silicon-on-insulator substrate comprising bulk silicon, an insulation layer over the bulk silicon, and a silicon device layer over the insulation layer involving forming at least one conductive plug comprising a conductive material within the bulk silicon and the insulation layer so as to contact the silicon device layer.

In another embodiment, the present invention relates to a method of forming a silicon-on-insulator substrate involving providing a first silicon substrate comprising a first silicon layer; forming a first insulation layer over the first silicon layer to provide a first structure; providing a second structure comprising a second silicon layer and a second insulation layer; bonding the first structure and the second structure together so that the first insulation layer is adjacent the second insulation layer; removing a portion of the second silicon layer; forming a contact hole in the first silicon layer, the first insulation layer, and the second insulation layer so as to contact the second silicon layer using an anisotropic etch; and depositing a conductive material in the contact hole.

In yet another embodiment, the present invention relates to a silicon-on-insulator structure, made of a silicon substrate layer; an insulation layer over the silicon substrate layer; a silicon device layer comprising silicon over the insulation layer; a conductive plug through the silicon substrate layer and the insulation layer contacting the silicon device layer; and a heat generating structure on the silicon device layer at least partially overlapping the conductive plug.

DISCLOSURE OF INVENTION

Figure 1:
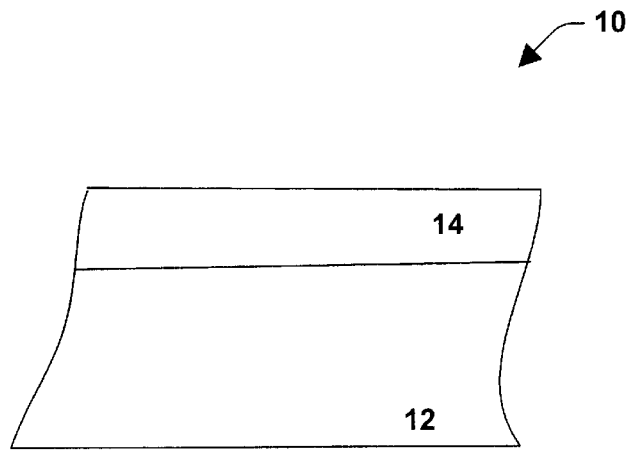
FIG. 1 is a cross-sectional view of a first structure used to make an SOI substrate according to one embodiment of the present invention.

By forming an SOI substrate having improved heat removal characteristics, the performance of devices subsequently formed on the SOI substrate can be substantially improved. While not wishing to be bound to any theory, it is believed that by forming a backside contact according to the present invention, it is consequently possible to increase the amount of heat that may be removed (and/or increase the rate at which heat may be removed) from the device layer of the SOI substrate by dissipating heat through the conductive plugs. Improving the removal of heat from the device layer consequently improves the performance and increases the life of devices, such as MOSFETs, formed on the device layer of the SOI substrate.

The present invention involves positioning one or more contacts or conductive plugs (thermally conductive) adjacent and/or within the silicon device layer to draw any heat away from the silicon device layer, through the plugs down into the bulk silicon layer of an SOI substrate. In the completed SOI substrate, the conductive plugs act as heat dissipaters. The conductive plugs, typically comprising metal, have a relatively high thermal conductivity and thus facilitate the transfer of heat away from (preventing local build-up of) heat generated in the device layer of the SOI substrate.

The conductive plugs are formed through the backside of the SOI substrate, and extend at least to the silicon device layer. That is, one or more conductive plugs are formed through the bulk silicon layer and the buried insulation layer of the SOI substrate. The one or more conductive plugs extend roughly from the backside surface to the undersurface of the silicon device layer, and preferably, just into the silicon device layer. The one or more conductive plugs are formed before, during or after various structures, devices and/or regions are formed on and/or in the silicon device layer and collectively referred to as heat generating structures. Heat generating structures include active elements and passive elements including polysilicon gates, word lines, source regions, drain regions, ionized regions, bit lines, bases, emitters, collectors, conductive lines, electrical contacts between various structures, etc.

The conductive plugs contain a conductive material that conducts heat, such as a metallic material. The conductive material includes metallic materials such as conductive metals (heat conductive), conductive metal silicides, and conductive metal nitrides. Conductive materials also include non-conductive materials having a conductive substance dispersed therein so that the combined composite conducts. In this connection, the conductive plugs contain a conductive material that conducts heat, and optionally a barrier material. The barrier material at least does not inhibit the metallic material from conducting heat. In a preferred embodiment, the barrier material is a heat conducting material. The barrier layer, if employed, serves as a diffusion barrier layer preventing the conductive material of the conductive plug core from diffusing into the buried insulation layer and/or bulk silicon layer. The barrier layer is thus formed to a thickness suitable for minimizing or preventing such diffusion. In one embodiment, the thickness of the optional barrier layer is from about 50 Å to about 1,500 Å. In another embodiment, the thickness of the optional barrier layer is from about 100 Å to about 1,000 Å.

Metallic materials include one or more of aluminum, chromium, cobalt, copper, gold, iridium, iron, lead, molybdenum, nickel, niobium, platinum, palladium, scandium, silver, tantalum, tin, titanium, tungsten, zinc, alloys thereof, nitrides thereof, and suicides thereof. At least one of aluminum, chromium, copper, aluminum-copper alloys, platinum, titanium, tungsten, and titanium-tungsten alloys are preferred. In another preferred embodiment, the conductive plugs contain a metal nitride or metal silicide barrier layer and a metal or metal alloy core. For example, the conductive plug may comprise a copper core surrounded by a titanium nitride barrier layer, an aluminum core surrounded by a tantalum barrier layer, and an aluminum-copper alloy core surrounded by a titanium nitride barrier layer.

The thermal conductivity of the conductive plugs is relatively high compared to the thermal conductivity of the insulation layer and bulk silicon. In one embodiment, the thermal conductivity of the conductive plugs is at least 100 times higher than the thermal conductivity of the insulation layer. In this connection, the conductive plugs typically have a thermal conductivity of at least about 150 W/m° C., and more typically at least about 200 W/m° C. In another embodiment, the thermal conductivity of the conductive plugs is at least 200 times higher than the thermal conductivity of the insulation layer.

The conductive plug is formed in a contact hole, which is in turn formed using a reactive ion etch (RIE) apparatus or an electron cyclotron resonance (ECR) plasma reactor. RIE apparatus and ECR plasma reactors are commercially available. A parallel plate RIE apparatus is preferred. Etching or forming a contact hole is an anisotropic etch process. The contact holes are formed in any location on the SOI wafer, but preferably, the contact holes are formed below or near heat generating structures or devices, such as MOSFETs or conductive lines.

In a preferred embodiment, separate etch chemistries are employed to form the contact hole through the bulk silicon layer and the buried insulation layer. When etching the bulk silicon layer, at least one or more halogen containing compounds, such as one of HBr, HCl, $Cl_2$, $NF_3$, $SF_6$, $CH_3F$, $C_4F_8$, $CF_4$ and $CHF_3$ is used as the etch plasma. When etching the buried insulation layer, at least one or more fluorine compounds, such as one of $NF_3$, $SF_6$, $CH_3F$, $C_4F_8$, $CF_4$ and $CHF_3$ optionally with an oxygen containing compound, such as $O_2$, is used as the etch plasma. The etch plasmas optionally further contain a carrier gas, such as a noble gas or nitrogen.

The shape of the contact holes is not critical. In most embodiments, the contact holes are in the shape of a cylinder or cone. The contact hole is formed to any width suitable for dissipating heat from the silicon device layer. In one embodiment, the contact holes have a diameter from about 500 Å to about 5,000 Å. In another embodiment, the contact holes have a diameter from about 750 Å to about 4,000 Å. In yet another embodiment, the contact holes have a diameter from about 1,000 Å to about 3,000 Å.

The conductive plugs are formed in any suitable manner in the bulk silicon layer and the buried insulation layer. For example, a conductive material such as a metallic material is deposited in the contact hole. This is accomplished by physical vapor deposition (PVD) and particularly sputtering or chemical vapor deposition (CVD). Such methods are known in the art. After one or more conductive materials are deposited in the contact hole, the structure is planarized to the surface of the bulk silicon layer; that is, portions of the metallic material are removed from the surface of bulk silicon layer (the underside of the resultant SOI substrate). The contact opening remains filled or at least substantially filled with a conductive plug including an optional barrier layer. Any suitable technique may be used to planarize the substrate and may depend, for instance, on the specific identity of the conductive material used to make the conductive plug. In one embodiment, the substrate is planarized using chemical mechanical polishing (CMP) techniques using a polishing solution or slurry.

The SOI substrate in accordance with the present invention is made using any of dielectric isolation, wafer bonding and etchback, separation by implanted oxygen (SIMOX), zone melting recrystallization, full isolation by porous oxidized silicon, and selective oxidation with selective epitaxial growth. SIMOX and wafer bonding and etchback techniques are preferred. Forming the conductive plugs in accordance with the present invention may be conducted before during or after completion of the base SOI substrate (formation of a bulk silicon layer, a buried insulation layer over the bulk silicon layer, and a silicon device layer over the buried insulation layer). For example, in embodiments using SIMOX techniques, the conductive plugs may be formed before, during or after various structures, devices and/or regions are formed on/in the silicon device layer.

The SOI substrate formed in accordance with the present invention has a bulk or monocrystalline silicon layer, a buried insulation layer over the bulk silicon layer, and a silicon layer (device layer) over the buried insulation layer, wherein conductive plugs extend from the bottom surface of the bulk silicon layer through the bulk silicon layer and buried insulation layer. The buried insulation layer typically contains silicon dioxide, although the insulation layer may contain any suitable insulating or oxide material. The buried insulation layer has thickness from about 100 Å to about 5,000 Å. In another embodiment, the buried insulation layer has thickness from about 1,000 Å to about 4,000 Å. In another embodiment, the buried insulation layer has thickness from about 2,000 Å to about 3,500 Å. The device layer has thickness from about 500 Å to about 5,000 Å. In another embodiment, the device layer has thickness from about 1,000 Å to about 3,000 Å.

The conductive plugs serve to further facilitate the transfer of heat away from the device layer, and particularly away from the silicon device layer. Heat removed via the conductive plugs is dissipated in the bulk silicon layer.

Referring to FIGS. 1 to 5, a specific example of the present invention is described. Specifically referring to FIG. 1, a first structure 10 is formed. Initially, a bulk silicon substrate or wafer 12 is provided. An insulation layer 14 containing silicon dioxide is then formed over the bulk silicon by CVD techniques. Either low pressure chemical vapor deposition (LPCVD) or plasma enhanced chemical vapor deposition (PECVD) may be employed. In this embodiment, the insulation layer 14 is formed by PECVD using either silane and oxygen or silane and nitrous oxide. Alternatively, a wet or dry oxidation process may be employed to form the insulation layer 14. The insulation layer 14 has a thickness of about 1,500 Å.

Figure 2:
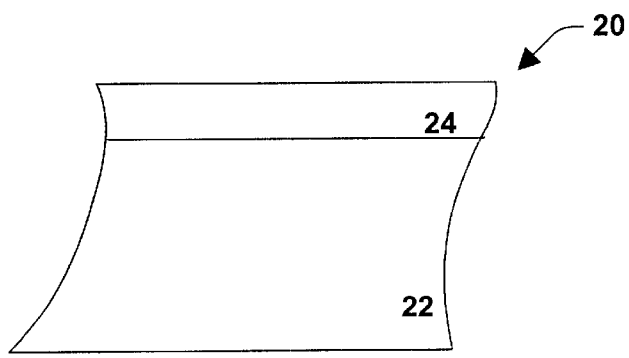
FIG. 2 is cross-sectional view of a second structure used to make an SOI substrate according to one embodiment of the present invention.

Referring to FIG. 2, a second structure 20 is provided. The second structure 20 contains a bulk silicon layer 22 and an insulation layer 24 thereover. In this embodiment, the insulation layer 24 contains silicon dioxide. The insulation layer 24 is formed by PECVD using either silane and oxygen or silane and nitrous oxide. Also in this embodiment, the thickness of the insulation layer 24 is about 1,500 Å.

Figure 3:
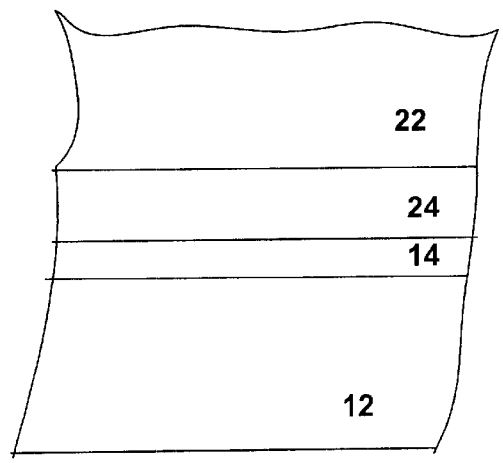
FIG. 3 is cross-sectional view of a bonded structure used to make an SOI substrate according to one embodiment of the present invention.

Referring to FIG. 3, the first structure 10 is bonded to the second structure 20 at the respective insulation layers 14 and 24. The respective insulation layers 14 and 24 are fused by application of heat for a sufficient period of time to bond the first and second structures 10 and 20. For example, the first and second structures 10 and 20 are held together for about 2 hours under a temperature of about 1,100° C.

Figure 4:
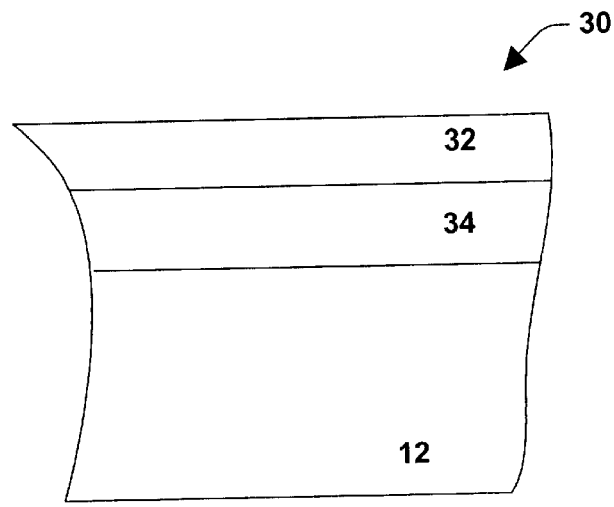
FIG. 4 is cross-sectional view of bonded structure used to make an SOI substrate according to one embodiment of the present invention.

Referring to FIG. 4, the bulk silicon layer 22 of in FIG. 3 of the second structure 20 is etched to a desired thickness to provide SOI structure 30 and specifically a device layer 32. The SOI structure 30 contains bulk silicon layer 12, buried insulation layer 34, and device layer 32. The thickness of the device layer 32 is about 1,500 Å. The thickness of the insulation layer 34 (formerly the insulation layers 14 and 24) is about 3,000 Å.

Figure 5:
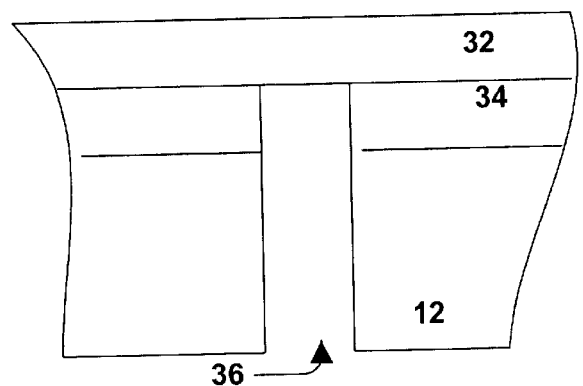
FIG. 5 is cross-sectional view of bonded structure used to make an SOI substrate according to one embodiment of the present invention.

Referring to FIG. 5, a contact hole 36 is formed through the bulk silicon layer 12 and buried insulation layer 34, to the device layer 32 using suitable lithography and etching techniques. Although not shown, a resist is deposited on the bulk silicon layer 12, selectively exposed, and developed to form a patterned resist exposing a portion of the bulk silicon layer 12 corresponding to the formation of a contact hole. Next, an anisotropic RIE process is employed using $SF_6$ to etch the bulk silicon and $CH_3F/O_2$ to etch the silicon dioxide (down to the silicon device layer). The contact hole 36 has a diameter of about 2,000 Å.

Figure 6:
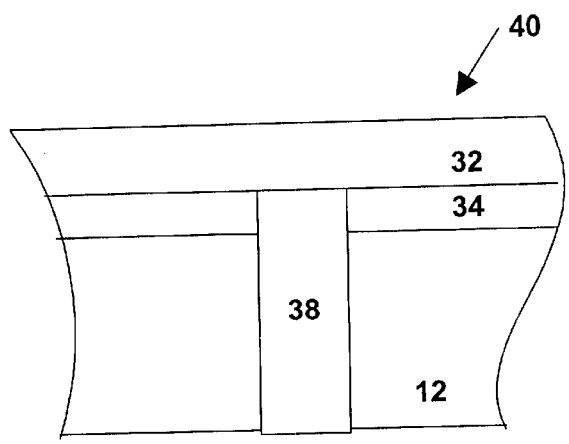
FIG. 6 is cross-sectional view of an SOI substrate according to one embodiment of the present invention.

Referring to FIG. 6, a conductive material is deposited into the using CVD or PVD techniques. In this embodiment, a tungsten-titanium alloy is deposited contact hole 36 to form conductive plug 38. Although not shown, the conductive plug 38 optionally further contains a barrier layer. After deposition of the alloy, a CMP process is employed to remove excess alloy from the bulk silicon layer 22 surface and planarize the bottom of the resultant SOI substrate 40. Only one conductive plug 38 is shown in SOI substrate 40, however, it is understood that in most instances, an SOI substrate made in accordance with the present invention can have a plurality of conductive plugs.

The SOI substrate 40 has good heat removal properties due to the presence of the conductive plug 38 containing a tungsten-titanium alloy. In particular, the high thermal conductivity of the metal alloy of the conductive plug (relative to silicon dioxide) removes or dissipates heat that may locally accumulate in certain areas (typically near or under devices and/or conductive structures) of the device layer and insulation layer. The SOI substrate 40 is made by wafer bonding and etchback techniques, although it is understood that other techniques may be employed, such as SIMOX techniques.

Figure 7:
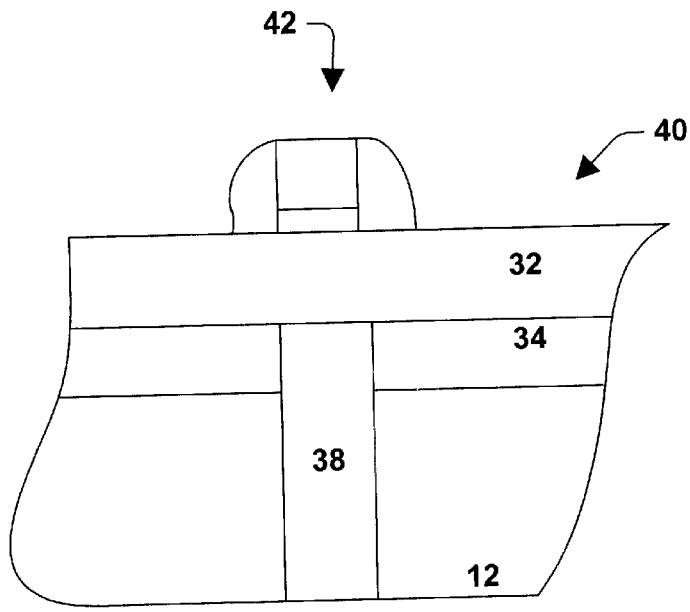
FIG. 7 is cross-sectional view of an SOI substrate according to another embodiment of the present invention.

In this connection, referring to FIG. 7, the SOI substrate 40 made in accordance with the present invention is shown with a heat generating device 42 positioned over the conductive plug 38. In particular, a MOSFET 42 is positioned over the conductive plug 38. Due to the configuration, heat generated by the MOSFET 42 is dissipated from the device layer 32 through the conductive plug 38 into the bulk silicon layer 22. More reliable operation of heat generating devices, such as MOSFETs, is achieved due to the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

Figure 8:
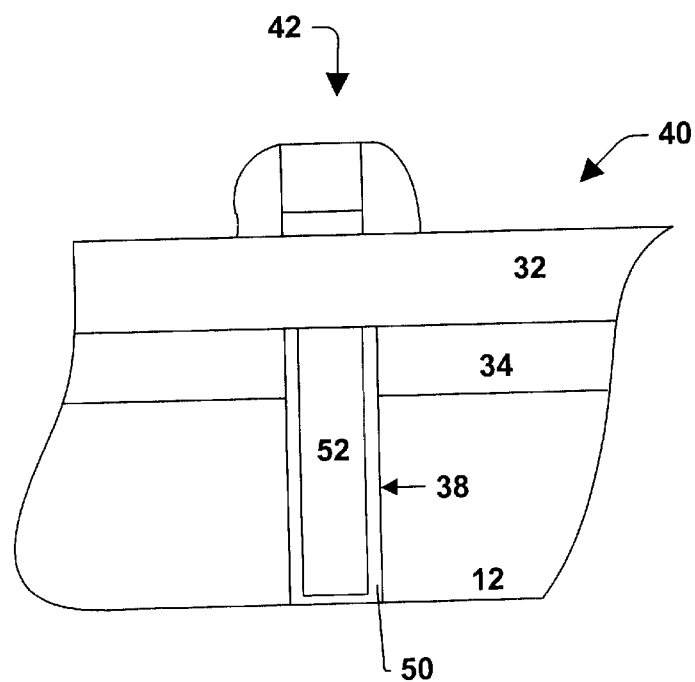
FIG. 8 is a cross-sectional view of an SOI substrate according to yet another embodiment of the present invention.

In another embodiment, referring to FIG. 8, the SOI substrate 40 made in accordance with the present invention is shown with a heat generating device 42 positioned over the conductive plug 38. The conductive plug 38 is made of barrier metal 50 surrounding conductive metal 52. In particular, a MOSFET 42 is positioned over the conductive plug 38. Due to the configuration, heat generated by the MOSFET 42 is dissipated from the device layer 32 through the conductive plug 38 into the bulk silicon layer 22.

What is claimed is:

1. A silicon-on-insulator structure, comprising:

a silicon substrate layer;

an insulation layer over the silicon substrate layer;

a silicon device layer comprising silicon over the insulation layer;

a conductive plug through the silicon substrate layer and the insulation layer contacting the silicon device layer, wherein the conductive plug extends just into the silicon device layer; and a heat generating structure having a channel region formed in said silicon device layer, said channel region at least partially overlapping the conductive plug, wherein the conductive plug has an end surface which is substantially flush with a bottom surface of the silicon substrate layer.

* * * * *